United States Patent [19]
Lee et al.

[11] Patent Number: 5,621,345

[45] Date of Patent: Apr. 15, 1997

[54] IN-PHASE AND QUADRATURE SAMPLING CIRCUIT

[75] Inventors: Wai L. Lee, Wilmington, Mass.; Norman D. Grant, Windham, N.H.; Paul F. Ferguson, Jr., Dracut, Mass.

[73] Assignee: Analog Devices, Inc., Norwood, Mass.

[21] Appl. No.: 418,546

[22] Filed: Apr. 7, 1995

[51] Int. Cl.[6] ............................. H03C 3/00; H03H 11/16
[52] U.S. Cl. ........................ 327/254; 327/552; 327/557; 364/724.1; 375/261
[58] Field of Search ..................... 327/552, 555, 327/557, 558, 559, 91, 254; 364/724.01, 724.1; 341/143, 155, 115; 375/27, 28, 39, 103, 244, 247, 261, 350, 298

[56] References Cited

U.S. PATENT DOCUMENTS

| | | | |
|---|---|---|---|
| 4,647,789 | 3/1987 | Upadhyayula | 327/254 |
| 4,730,345 | 3/1988 | Reeve, III | 327/552 |
| 4,803,700 | 2/1989 | Dewey et al. | 375/77 |
| 4,893,316 | 1/1990 | Janc et al. | 375/44 |
| 5,121,057 | 6/1992 | Huber et al. | 327/552 |
| 5,157,395 | 10/1992 | Del Signore et al. | 341/143 |
| 5,249,204 | 9/1993 | Funderburk et al. | 375/97 |
| 5,249,578 | 10/1993 | Karp et al. | 128/661.01 |
| 5,339,263 | 8/1994 | White | 364/724.1 |
| 5,357,221 | 10/1994 | Matero | 327/254 |
| 5,442,353 | 8/1995 | Jackson | 341/143 |
| 5,450,083 | 9/1995 | Brewer | 341/143 |
| 5,482,044 | 1/1996 | Lin et al. | 128/660.07 |

Primary Examiner—Timothy P. Callahan
Assistant Examiner—My-Trang Nu Ton
Attorney, Agent, or Firm—Wolf, Greenfield & Sacks, P.C.

[57] ABSTRACT

A circuit that provides samples of in-phase and quadrature components of an input waveform includes an oversampling ADC that receives the input waveform and converts the input waveform to digital samples at an oversampling rate. A first digital filter, coupled to the ADC, receives the digital samples from the ADC and provides the in-phase component samples of the input waveform. A second digital filter, coupled to the ADC, receives the digital samples from the ADC and provides the quadrature component samples of the input waveform.

16 Claims, 4 Drawing Sheets

IN-PHASE AND QUADRATURE SAMPLING CIRCUIT

FIELD OF THE INVENTION

The present invention relates generally to an in-phase and quadrature sampling circuit and, more particularly, to an in-phase and quadrature sampling circuit including a unique digital filter.

BACKGROUND OF THE INVENTION

It is advantageous in radio, sonar and some other communications systems to develop samples of base-band in-phase and quadrature components of an input bandpass signal. A bandpass signal of center frequency $f_{IF}$ can be demodulated into baseband by mixing with a complex sinusoidal signal $e^{j2\pi f_{IF} t}$ of frequency $f_{IF}$. The resulting baseband signal is a complex signal with a real, or "in-phase" component represented by I, and an imaginary, or "quadrature", component represented by Q. Once a bandpass signal is demodulated into its in-phase and quadrature components, various commonly used modulation schemes such as amplitude (AM), frequency (FM), single-side-band (SSB), and quadrature-amplitude-phase modulations can be extracted by simple arithmetic operations. For example, the upper side-band of a SSB modulated signal can be extracted by adding the I and Q components together. Furthermore, it is advantages especially when data communication is involved, to digitized the output to produce digital output samples of the I and Q components.

FIG. 1 is a block diagram showing a conventional analog circuit for demodulating the in-phase (I) in quadrature (Q) components of an input analog signal. The analog signal is received on input line 10, which is then split into in-phase line 12 and quadrature phase line 14. Cosine mixer 16 mixes the analog input signal with a cosine signal (at the center frequency of the pass-band of the input signal) and provides the mixed signal along line 18 to low pass filter (LPF) 20, which attenuates undesirable image by-products of the mixing. The filtered signal is provided along line 22 to analog-to-digital converter (ADC) 24 which converts the analog signal to in-phase samples at a sampling rate $f_s$ and provides the in-phase samples I on bus 26.

Similarly, sine mixer 28 mixes the input analog waveform with a conventional sine wave and provides the mixed signal on line 30 to LPF 32. LPF 32 attenuates undesirable image by-products of the mixing and provides the filtered signal on line 34 to ADC 36. ADC 36 converts the filtered signal to digital quadrature samples at a sampling rate $f_s$ and provides the quadrature output samples Q on bus 38.

The circuit of FIG. 1 has a number of drawbacks and constraints. For example, the circuit is difficult to implement. The sine and cosine waveforms must be exactly 90° out of phase with each other in order to produce accurate in-phase and quadrature samples. In data communication, mismatches in the sine and cosine phases will result in bit errors. In addition, the two mixers must have good linearity to avoid mixing in spurious frequency components.

FIG. 2 is a block diagram of another prior art approach which addresses some of the drawbacks and constraints of the circuit of FIG. 1. The circuit of FIG. 2 performs the out-of-phase mixing of the input waveform in the digital domain, avoiding the use of a problematic analog multipliers and providing tight control over the sine and cosine waveforms. The analog input waveform is received on line 10 and converted to a digital signal by ADC 40. The digital signal is provided on buses 44 and 45. Digital multiplier 46 multiplies the converted samples received on bus 44 with cosine-wave samples (i.e., coefficients) and provides the multiplied samples on bus 48 to decimator 50. Decimator 50 conventionally decimates, or downsamples, the cosine-multiplied samples and provides in-phase samples (I) on output bus 52.

Similarly, digital multiplier 54 multiplies the samples received on bus 46 by sine-wave samples and provides the multiplied samples on bus 56 to decimator 58. Decimator 58 downsamples the sine-multiplied samples and provides quadrature (Q) output samples on bus 60. Decimator 58 operates at the same rate as does decimator 50. The drawbacks of this approach are the complexity and cost of the digital-signal-processing and in the need for high-speed, high-resolution ADC.

FIG. 3 is a block diagram showing an improved implementation of the circuit of FIG. 2 using a sigma-delta ADC for which $f_s=4\times f_{IF}$ where $f_s$ is the sampling frequency of the sigma-delta ADC and $f_{IF}$ is the center frequency of the pass-band of the analog input waveform. The sigma-delta ADC provides a one-bit digital stream at an oversampling rate and performs noise-shaping such that the quantization noise power is shifted to frequencies outside of the band of interest. As will be understood by those skilled in the art, four evenly-spaced samples of a cosine signal may equal the set of values $\{1, 0, -1, 0\}$; and four corresponding evenly-spaced samples of a sine waveform, being 90° out of phase with the cosine waveform, then will have values $\{0, -1, 0, 1\}$. These sampled (i.e., coefficient) values are used, respectively, by the multipliers 46 and 54, in the prior art circuit of FIG. 3, as the cosine and sine samples which are multiplied with the input signal. Multiplication by such a limited set of coefficients (i.e., 1, 0 and −1) can be implemented simply with conventional logic, as will be appreciated by those skilled in the art.

While the digital circuit of FIG. 3 does provide advantages over the analog circuit of FIG. 1, in terms of increasing the simplicity and performance of the multipliers, the system suffers from a number of drawbacks. Specifically, because the frequency of the input waveform must be ¼ that of the sampling frequency (or similarly related), the oversampling ratio (OSR) of the sigma-delta ADC is limited. This places a great demand on the anti-aliasing filter (not shown) which precedes the circuit to reduce low frequency components of the input waveform before conversion. The oversampling ratio (OSR) for a band-pass sigma-delta ADC is defined as the sampling frequency $f_s$ divided by twice the bandwidth $f_{BW}$ of the input waveform: $OSR=f_s/2f_{BW}$. A typical example includes an input waveform having a center frequency IF=455, kHz having a bandwidth $f_{BW}$ 30 kHz, and a sigma-delta converter having a sampling rate $f_s=1.8$ MHz. In this example, the oversampling would be equal to approximately 30, which is quite small. As a result, the signal-to-noise ratio of the output samples is relatively low and may not be acceptable for accuracy reasons.

SUMMARY OF THE INVENTION

The aforementioned drawbacks of the prior art are overcome by a circuit that includes an oversampling ADC that receives the input waveform and converts the input waveform to digital samples at an oversampling rate; a first digital filter which receives the digital samples from the ADC directly and provides the in-phase component samples of the input waveform; and second digital filter which receives the digital samples from the ADC directly and provides the quadrature component samples of the input waveform.

In an exemplary embodiment of the present invention, the first and second digital filters perform the function of demodulating the I and Q components while also decimating the ADC output samples.

In an exemplary embodiment, each coefficient for the first digital filter include the product of a corresponding constant decimation filter coefficient value and respective a cosine wave coefficient; similarly each coefficient for the second digital filter include the product of a corresponding constant decimation filter coefficient value and a respective sine wave coefficient.

DETAILED DESCRIPTION

Figure 1:
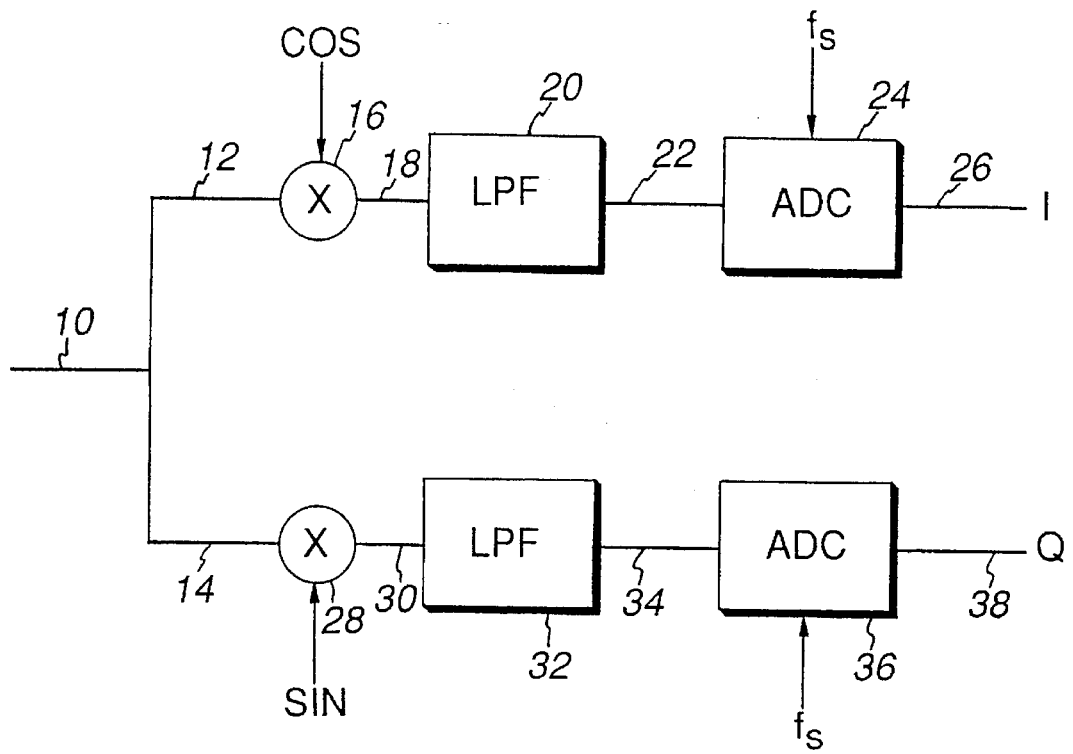
FIG. 1 is a block diagram of a prior art in-phase and quadrature sampling circuit.
Figure 2:
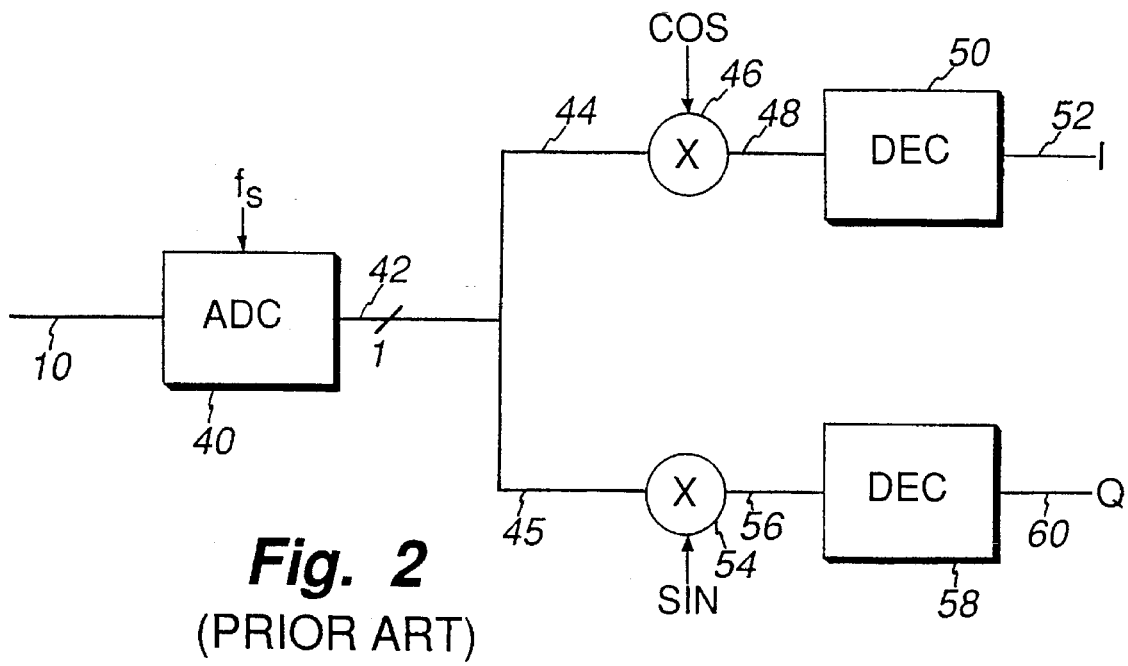
FIG. 2 is a block diagram of another prior art in-phase and quadrature sampling circuit.
Figure 3:
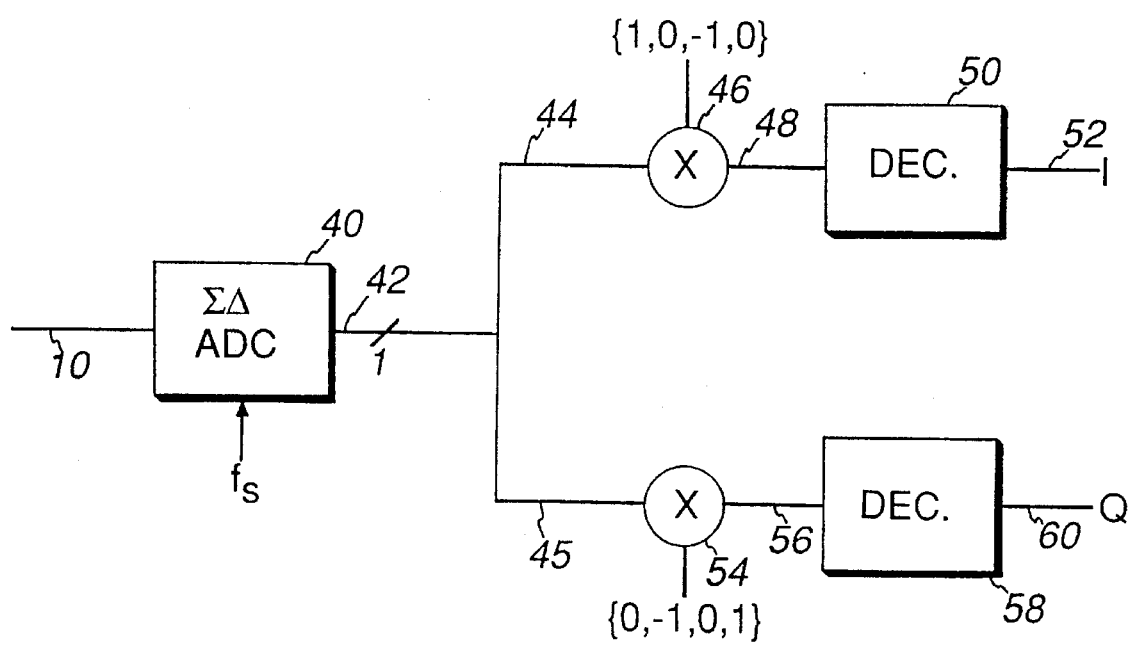
FIG. 3 is a block diagram of a specific implementation of the prior art in-phase and quadrature sampling circuit of FIG. 2.
Figure 4:
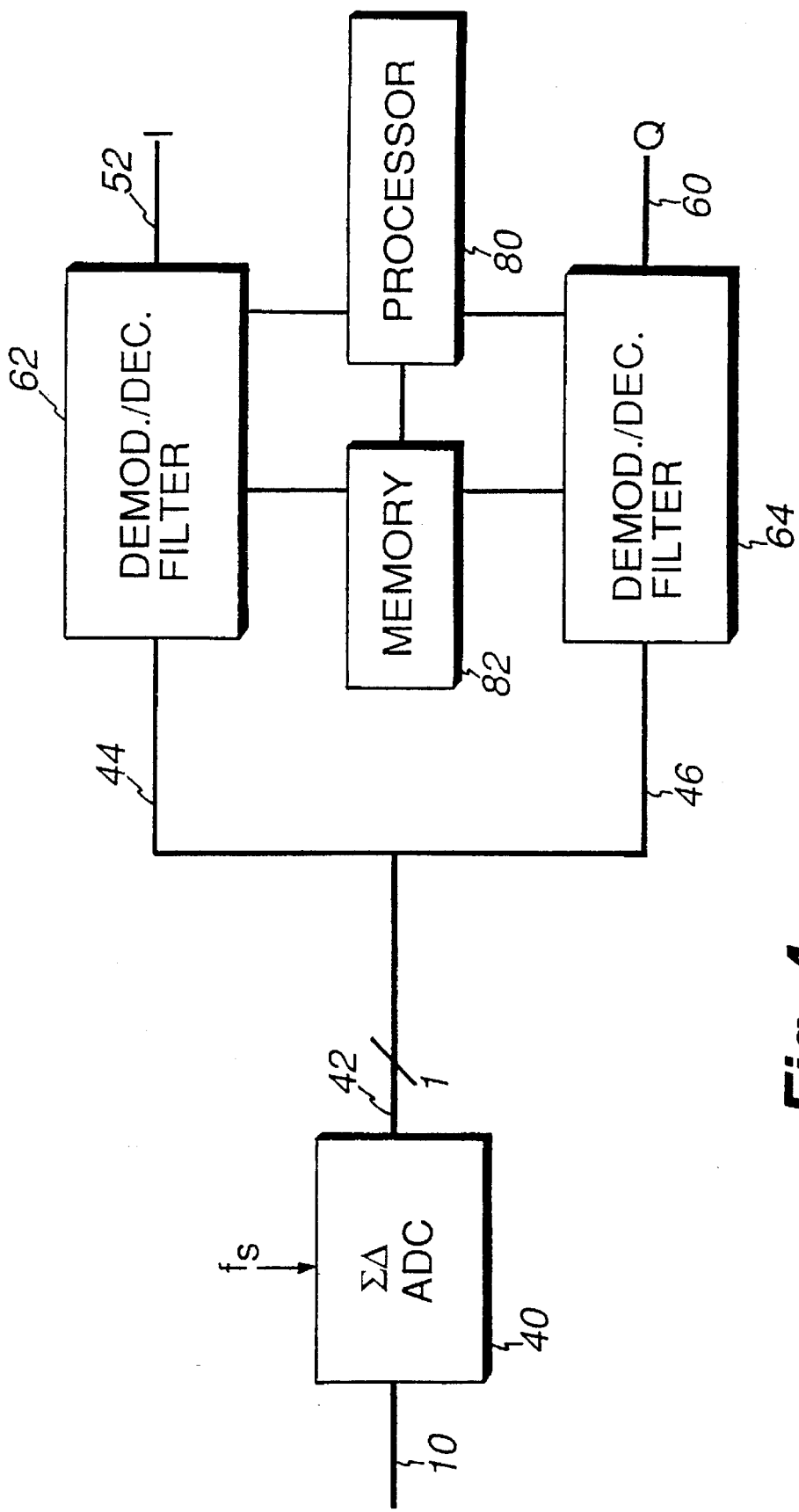
FIG. 4 is a block diagram of an exemplary in-phase and quadrature sampling circuit according to the present invention.

FIG. 4 is a block diagram of an illustrative embodiment of an in-phase and quadrature sampling circuit according to the present invention. The circuit of FIG. 4 receives an analog input waveform on line 10. Sigma-delta ADC 40 converts the input analog waveform to a one-bit digital stream at a sampling rate $f_s$ and a predefined oversampling ratio. The one-bit digital stream is provided on bus 42 and to buses 44 and 46. The one-bit digital stream is filtered by digital filter 62 and in-phase samples are provided on output bus 52. Similarly, the one-bit digital stream is filtered by digital filter 64 and output quadrature samples are provided on output bus 60.

Digital filter 62 and digital filter 64 each perform the functions of both demodulation and decimation by the downsampling ratio. Of course, the demodulation performed by filter 62 preferably is 90° out of phase with the demodulation performed by digital filter 64. The decimation performed by digital filter 62 is identical to that performed by digital filter 64. In other words, both filters 62 and 64 downsample the samples received from the ADC by the same downsampling ratio. That downsampling ratio is equal to the oversampling ratio of the sigma-delta ADC modulator.

Figure 5:
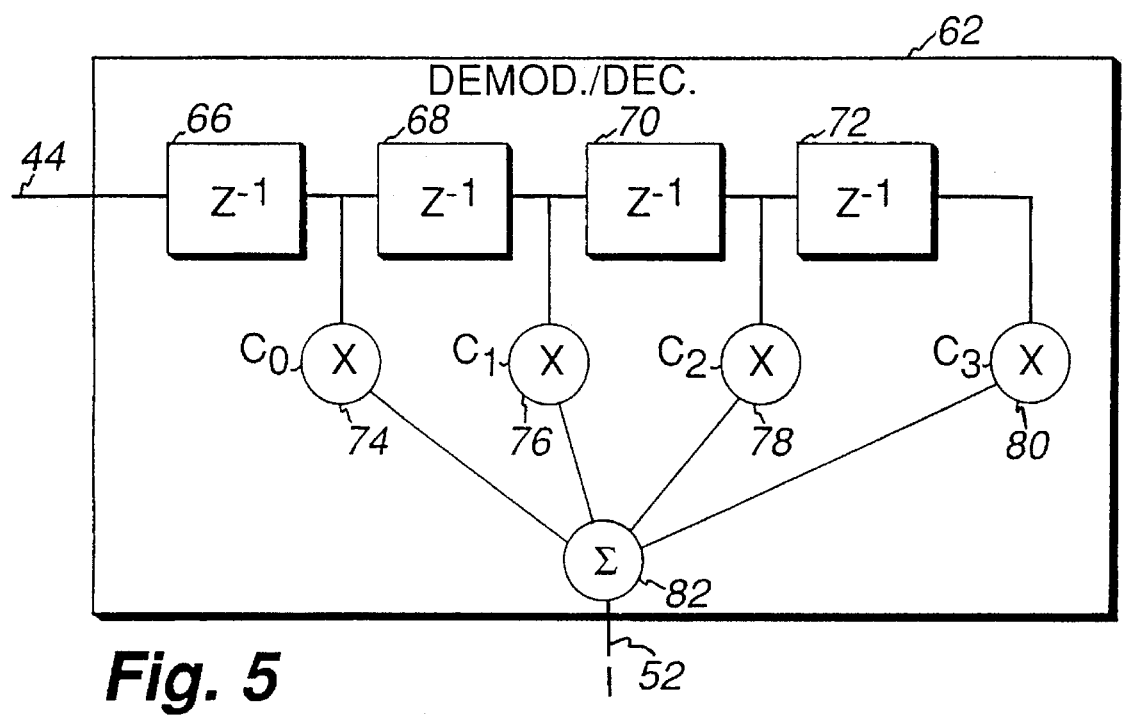
FIG. 5 is a detailed block diagram of an exemplary digital filter for use in the circuit of the present invention.

One implementation of the demodulator/decimator filter 62 is shown in the simple block diagram of FIG. 5. While the digital filter 62, as illustrated, includes a four-tap delay line filter, it should be understood by those skilled in the art that a filter with many more stages is commonplace and may be used such as, for example, a filter with 4,096 taps.

Filter 62 includes delay elements 66, 68, 70 and 72 connected in cascade to input bus 44. The node between each delay element is connected to a different one of four multipliers 74, 76, 78 and 80. Multipliers 74, 76, 78 and 80 have (or receive) corresponding coefficients C0, C1, C2 and C3, respectively, by which they multiply their signal inputs.

The outputs from the multipliers are provided to summer 82, which provides digital output samples on bus 52.

Once a decimation filter function is known, the value for each of the coefficients Cx (where x=0, 1, . . . ) is equal to the product of the corresponding sampled cosine coefficient and the coefficient of the decimation filter function for that tap. For example, assuming $f_s = 4 \times f_{IF}$, and 4 sine wave sample coefficients used and four cosine wave sampled coefficients are used. In this example, coefficient $C0 = \text{cosine } \theta_0 \times h_0$, coefficient $C1 = \text{cosine } \theta_1 \times h_1$, coefficient $C2 = \text{cosine } \theta_2 \times h_2$, and coefficient $C3 = \text{cosine } \theta_3 \times h_3$, where cosine θhd nrepresents the nth sampled cosine coefficient and $h_n$ represents the constant conventional decimation filter coefficient for the corresponding sample.

As an example, assume $f_s = 1.82$ and $f_{IF} = 455$ kHz. Also assume that $h_0 = 1$, $H_1 = 2$, $h_2 = 2$, $h_3 = 1$, and cosine θ=1, cosine θ=0, cosine θ=1, and cosine θ=1. Thus, $C_0 = 1$, $C_1 = 0$, $C_2 = 2$, $C_3 = 0$.

The digital filter 64, corresponding to the sine wave demodulator, is identical to filter 62 shown in FIG. 5 except that the coefficients therefor are generated as a product of the corresponding sampled sine wave coefficient and the constant conventional decimator coefficient for each tap.

The sine wave and cosine wave sampled coefficients may be treated as remaining constant at each tap when the output samples of the filter are enabled, if the following criterion is met: $f_{IF} = K(f_s/DSR)$, where K is a constant and DSR is the downsampling ratio of the decimation filter. If this criterion is met, and $f_s$ and $f_{IF}$ are known, then the filter coefficients can be computed and preprogrammed.

Thus, one advantage of this invention is that conventional decimation filters for a pair of non-quadrature channels can be reprogrammed with the known (computed) coefficients, to implement a dual demodulation/decimation function, and provide in-phase and quadrature sampled outputs as taught herein.

Additionally, simple one-bit decimation filters and one-bit sigma-delta ADCs are used in the exemplary circuit of the present invention. Such elements are very simple and inexpensive to implement. The steps of conversion, decimation, I and Q demodulation, and low-pass filtering are all performed in two very simple stages.

As an alternative to "pre-programming" the digital filter, by including or hard-wiring only a single set of the coefficients, multiple sets of coefficients also can be stored and made available to the filters, loosening the constraints on the required relationship between $f_{IF}$ and $f_s$. Particularly, if multiple different coefficients were stored, then the restriction on the operating rate of the modulator would be loosened. Particularly, the following relationship would be available: $f_{IF} = K/b(f_s/DSR)$, where K/b is a fractional relationship rather than an integer relationship. This loosened criterion would allow for multiple different relationships between $f_s$ and $f_{IF}$ so long as the multiple relationships are known ahead of time and therefore the multiple different sets of coefficients could be computed and stored.

Alternatively, as will be understood by those skilled in the art, the coefficients could be computed dynamically. If so, then the processor 80 would be used to compute the coefficients and the memory 82 used to store them, as shown in FIG. 4.

While there have been shown and described what are at present considered the preferred embodiments of the present invention, which have been disclosed by way of example only, it would be obvious to those skilled in the art that various changes and modifications can be made therein without departing from the spirit and scope of the invention as presented above and as defined by the appended claims and equivalents thereto. Particularly, while a specific circuit has been shown for implementing the digital filters according to the present invention, other filters having different coefficient values could be used. Also, while a sigma-delta ADC has been shown and described for use with the circuit of the present invention, other oversampling converters (i.e., non-sigma-delta converters) could be used.

What is claimed is:

1. A circuit that provides samples of in-phase and quadrature components of an input waveform comprising:

an oversampling ADC that receives the input waveform and converts the input waveform to digital samples having an input frequency at an oversampling rate;

a first digital decimation filter, coupled to the ADC, that receives the digital samples from the ADC and provides the in-phase component samples having a center frequency different from the input frequency; and a second digital decimation filter, coupled to the ADC, that receives the digital samples from the ADC and provides the quadrature component samples having a center frequency different from the input frequency.

2. The circuit as claimed in claim 1 wherein the oversampling ADC includes a sigma-delta ADC.

3. The circuit as claimed in claim 2 wherein the sigma-delta ADC includes a one-bit sigma-delta ADC.

4. The circuit as claimed in claim 1 wherein each of the first and second digital filters includes a multi-tap decimation/demodulation filter, and wherein the demodulation performed by the first filter is approximately 90 degrees out of phase with that of the second filter.

5. The circuit as claimed in claim 4 wherein the first digital filter includes multiple coefficients, at least one coefficient corresponding to each filter tap, each coefficient being equal to the product of a corresponding constant decimation filter coefficient value and a respective cosine wave sample value.

6. The circuit as claimed in claim 5 further including a memory element, coupled to the first digital filter, that stores a plurality of coefficients, at least two coefficients corresponding to each filter tap.

7. The circuit as claimed in claim 6 further including a processor, coupled to the memory element and the first digital filter, that dynamically computes the coefficients of the first digital filter.

8. The circuit as claimed in claim 4 wherein the second digital filter includes multiple coefficients, at least one coefficient corresponding to each filter tap, each coefficient being equal to the product of a corresponding constant decimation filter coefficient value and a respective sine wave sample value.

9. The circuit as claimed in claim 8 further including a memory element, coupled to the second digital filter, that stores a plurality of coefficients, at least two coefficients corresponding to each filter tap.

10. The circuit as claimed in claim 9 further including a processor, coupled to the memory element and the second digital filter, that dynamically computes the coefficients of the second digital filter.

11. The circuit as claimed in claim 4 wherein each of the digital filters includes a one-bit digital filter.

12. A method for providing in-phase and quadrature component samples of an input waveform comprising the steps of:

converting the input waveform to digital samples having an input frequency at an oversampling rate;

with a first digital decimation filter, providing, from the digital samples, the in-phase component samples having a center frequency different from the input frequency; and with a second digital decimation filter, providing, from the digital samples, the quadrature component samples having a center frequency different from the input frequency.

13. A method as claimed in claim 12 wherein the step of converting includes the step of sigma-delta modulating the input waveform.

14. A method as claimed in claim 12 wherein the first step of providing includes the step of demodulating and decimating the digital samples.

15. A method as claimed in claim 12 wherein the second step of providing includes the step of demodulating and decimating the digital samples.

16. A circuit that provides in-phase and quadrature component samples of an input waveform comprising:

means for converting the input waveform to digital samples having an input frequency at an oversampling rate;

first decimation means, coupled directly to the means for converting, for providing from the digital samples the in-phase component samples having a center frequency different from the input frequency; and second decimation means, coupled directly to the means for converting, for providing from the digital samples the quadrature component samples having a center frequency different from the input frequency.

* * * * *